United States Patent
Rotigni et al.

(10) Patent No.: US 9,226,386 B2
(45) Date of Patent: Dec. 29, 2015

(54) PRINTED CIRCUIT BOARD WITH REDUCED EMISSION OF ELECTRO-MAGNETIC RADIATION

(71) Applicants: STMicroelectronics S.r.l, Agrate Brianza (MB) (IT); Freescale Semiconductor, Inc., Austin, TX (US)

(72) Inventors: Mario Rotigni, Bergamo (IT); Richard Moseley, Georgetown, TX (US); Piyush Bhatt, Delhi (IN); Gregory Edgington, Lakeway, TX (US)

(73) Assignees: STMICROELECTRONICS S.R.L., Agrate Brianza (MB) (IT); FREESCALE SEMICONDUCTOR, INC., Austin, TX (US)

( * ) Notice: Subject to any disclaimer, the term of this patent is extended or adjusted under 35 U.S.C. 154(b) by 197 days.

(21) Appl. No.: 14/050,872

(22) Filed: Oct. 10, 2013

(65) Prior Publication Data

US 2014/0104800 A1   Apr. 17, 2014

(30) Foreign Application Priority Data

Oct. 30, 2012   (IT) .............................. MI2012A1847

(51) Int. Cl.
*H05K 1/18* (2006.01)
*H05K 1/02* (2006.01)

(52) U.S. Cl.
CPC ............ *H05K 1/0231* (2013.01); *H05K 1/0262* (2013.01); *H05K 2201/09663* (2013.01); *H05K 2201/10636* (2013.01); *H05K 2201/10689* (2013.01)

(58) Field of Classification Search
USPC .................... 361/763–784, 792–795, 803
See application file for complete search history.

(56) References Cited

U.S. PATENT DOCUMENTS

| 7,047,515 B1 | 5/2006 | Vitek |
| 2003/0224546 A1 | 12/2003 | Chen et al. |
| 2005/0108671 A1 | 5/2005 | Becker et al. |
| 2010/0039784 A1* | 2/2010 | Hayashi ................. 361/777 |

FOREIGN PATENT DOCUMENTS

| EP | 2 466 999 A1 | 6/2012 |
| WO | WO 01/58224 A1 | 8/2001 |

OTHER PUBLICATIONS

Italian Search Report and Written Opinion dated Jul. 15, 2013 from corresponding Italian Application No. MI2012A001847.

* cited by examiner

*Primary Examiner* — Tuan T Dinh
(74) *Attorney, Agent, or Firm* — Allen, Dyer, Doppelt, Milbrath & Gilchrist, P.A.

(57) ABSTRACT

A printed circuit board including a first outer layer, a second outer layer and an integrated circuit mounted on the second outer layer. The integrated circuit has a single exposed pad electrically connected to a ground reference, a first supply pin electrically connected to a first power supply and a second supply pin electrically connected to a second power supply, wherein the first power supply is configured to generate a first supply current with frequency components higher than the frequency components of a second supply current generated by the second power supply.

13 Claims, 7 Drawing Sheets

PRINTED CIRCUIT BOARD WITH REDUCED EMISSION OF ELECTRO-MAGNETIC RADIATION

CROSS REFERENCE TO RELATED APPLICATION

This application claims the priority benefit of Italian patent application serial number MI2012A001847, filed on Oct. 30, 2012, which is hereby incorporated by reference to the maximum extent allowable by law.

BACKGROUND

1. Technical Field

The present disclosure generally relates to the electronics field. More in particular, the present disclosure concerns a printed circuit board with reduced emission of electro-magnetic radiation.

2. Discussion of the Related Art

A printed circuit board (PCB) has the function of electrically connecting electronic components to each other, such as integrated circuits and power supplies of voltage or current.

It is necessary to use decoupling capacitors interposed between a power supply and an integrated circuit in order to provide the current necessary to perform abrupt transitions of the values of the supply current with high frequency components and in order to reduce the propagation of the noise generated by the integrated circuit.

In fact the power supply, the integrated circuit and the ground path form a loop which carries a return current towards ground with high frequency components, wherein said loop is a transmitting antenna supplied with the noise generated by the switching of the current absorbed by the integrated circuit, which can cause the emission of electro-magnetic radiation. Moreover, even the metal tracks of the printed circuit board can propagate the noise generated by the switching of the absorbed current and this noise is conducted on the wiring connected to the printed circuit board. Said wiring acts as potentially effective transmitting antennas, which further increase the emission of electro-magnetic radiation from the printed circuit board.

A known technique to perform the filtering of the noise generated by the switching of the current absorbed by the integrated circuits is to mount all the electronic components on the same outer side of the printed circuit board (indicated with "component side layer") and to use one or more capacitors (also referred to as "decoupling capacitors" or "by-pass") connected between the power supply voltage and the reference voltage to ground and placed close to the power supply and ground pins of the integrated circuit. The decoupling capacitors are connected between a supply pin and a ground pin of the integrated circuit: in this way each decoupling capacitor creates a local loop that carries a return current towards ground, wherein the local loop has a small size and thus it has a small inductance value. This allows to reduce the emission of electro-magnetic radiation of the board because the return current towards ground with high frequency components is limited in a loop having a small size and thus having a small inductance value, which is able to dampen the peaks of the dynamic fluctuations of the value of the power supply voltage caused by the abrupt transitions of the supply current and thus the emission of electro-magnetic radiation from the board is reduced.

Therefore the decoupling capacitor has the function of local reserve of electric charge, able to supply the current required during the abrupt transitions of the values of the supply current required for the operation of the integrated circuit supplied by supply current, dampening the peaks of the dynamic fluctuations of the power supply voltage caused by the abrupt transitions of the supply current.

Modern integrated circuits in many cases operate using two or more voltage power supplies having different values. For example, an integrated circuit comprises a supply pin for receiving a voltage of higher value (for example, 3.3 V or 5 V) to supply the interface circuits towards the outside connected with the Input/Output pins of the integrated circuit and comprises a further supply pin for receiving a voltage of lower value (for example, 1.2 or 1.8 V) to supply the logic circuits inside the integrated circuit. Moreover, the current flowing through the pin having the highest voltage has a trend of relatively low frequency components, while the current flowing through the pin with the lowest voltage has a trend of higher frequency components.

In an integrated circuit with two or more power supplies, it is necessary to electrically separate the return path of the current with high frequency components relating to a power supply voltage from the return path of the current with low frequency components relating to another power supply voltage, thereby preventing the noise generated by the switching of the current with high frequency transients from propagating within the board (for example, on the ground or power supply layers); this propagation may contribute to the generation of common mode currents that are the cause of considerable emission of electro-magnetic radiation by the board on which the integrated circuit is mounted.

The electrical separation between the return currents relating to two power supply voltages is typically obtained at the board level by keeping physically separated:

the return path towards ground of the electronic devices supplied by the power supply voltage and with supply current having high frequency components;

from the return path towards ground of the electronic devices supplied by the power supply voltage and with supply current having low frequency components.

Moreover, it is also maintained within the integrated circuit the physical and thus electrical separation between the ground of the elements supplied by a power supply voltage from the ground of the elements supplied by the other power supply voltage: consequently, the integrated circuit comprises several ground pins, each corresponding to a respective power supply voltage, facilitating the star connection in order to isolate from each other the return paths relating to different power supplies.

The integrated circuits enclosed in a package of QFP (Quad-Flat Pack) type have connection pins towards the outside which are placed only around the perimeter of the package.

Moreover, QFP packages having a single ground exposed pad are available and this allows to have a greater number of pins available for other functionalities along the perimeter of the package and a better thermal dissipation. Said ground exposed pad is typically placed at the center of the top or bottom surface of the package and utilizes a part of this surface.

Printed circuit boards are known that mount the electronic components on both the external layers of the board, for example in the case wherein there is an integrated circuit of considerable size (for example, a micro-processor) which requires a high number of other electronic components. In this case the electronic components are mounted on an outer layer (indicated as "component side layer") of the printed circuit board, while the integrated circuit is mounted on the other external layer (indicated as "soldering side layer"). In the case wherein the package of the integrated circuit mounted on the soldering side layer is of QFP type with a single ground exposed pad, said ground exposed pad is soldered on the soldering side and it is also necessary to connect the ground exposed pad with the components side layer by means of one or more via, in order to aid in the thermal dissipation of the QFP package.

The Applicant has observed that the connection of the ground exposed pad of the QFP package (mounted on the soldering side layer) with the components side layer creates a return loop towards ground that has a considerable size, because it crosses all the internal layers of the printed circuit board comprised between the soldering side layer and the component side layer (for example, in a board comprising four layers there are two inner layers, one for the connection of the signal pins and one for the ground): the considerable sizes generate a high inductance of the return loop towards ground that is created and generate a radiating structure internal to the board, thereby increasing the emission of electromagnetic radiation of the printed circuit board towards the outside and towards the board itself. This may not allow conformance to electro-magnetic compatibility tests as defined in international standards CISPR25 and IEC61967.

Moreover, the Applicant has observed that the QFP packages with a single ground exposed pad form a return path towards ground common to two or more power supplies of the integrated circuit, because there is only one ground pin to which the return paths towards ground relating to two or more power supplies of the integrated circuit are connected; therefore it is not possible to maintain the separation between the return currents towards ground of two or more different power supply domains. Therefore, when the integrated circuit with QFP package with a single ground exposed pad and with at least two power supplies is mounted on a printed circuit board, common mode currents are created, which considerably increase the emission of electro-magnetic radiation from the board and thus do not allow the conformance to the electro-magnetic compatibility test.

SUMMARY

According to an embodiment, there is provided a first outer layer, a second outer layer, an integrated circuit mounted on the second outer layer, said integrated circuit having a single exposed pad electrically connected to a ground reference, a first supply pin electrically connected to a first power supply, a second supply pin electrically connected to a second power supply, wherein the first power supply is configured to generate a first supply current with frequency components higher than frequency components of a second supply current generated by the second power supply, a first decoupling capacitor mounted on the second outer layer in the proximity of the first supply pin, the first decoupling capacitor having a first terminal electrically connected with the first supply pin and having a second terminal, an inner layer interposed between the first outer layer and the second outer layer, the inner layer comprising a metal layer electrically connected to said ground reference, a first via configured to electrically connect the exposed pad with the metal layer of the inner layer, a second via configured to electrically connect the second terminal of the first decoupling capacitor with the metal layer of the inner layer, and a second decoupling capacitor having a first pin electrically connected to the second power supply and having a second pin electrically connected to said ground reference.

According to another embodiment, the second decoupling capacitor is mounted on the first outer layer.

According to another embodiment, the first outer layer comprises a first metal layer electrically connected to said ground reference, wherein the first via is further configured to electrically connect the metal layer of the inner layer with the first metal layer of the second outer layer and wherein the second pin of the second decoupling capacitor is electrically connected to the first metal layer of the second outer layer.

According to another embodiment the printed circuit board includes a third via configured to electrically connect the exposed pad with the first metal layer of the second outer layer.

According to another embodiment, the second outer layer comprises a second metal layer electrically connected to the first power supply, the board further comprising a fourth via configured to electrically connect the first supply pin and the first pin of the first decoupling capacitor with the second metal layer of the second outer layer.

According to another embodiment, the second outer layer further comprises a third metal layer electrically connected to the second power supply, wherein the board further comprises a fifth via configured to electrically connect the second supply pin with the third metal layer of the first outer layer, wherein the first pin of the second decoupling capacitor is electrically connected with the third metal layer of the second outer layer.

According to another embodiment, the inner layer is contiguous to the second outer layer.

According to another embodiment the printed circuit board includes a third decoupling capacitor mounted on the second outer layer and having a first pin electrically connected to said ground reference and a second pin electrically connected to the first power supply.

According to another embodiment, the value of the capacitance of the second decoupling capacitor is about three times the value of the capacitance of the first decoupling capacitor.

According to another embodiment, the integrated circuit is enclosed by a package of the "Quad-Flat Pack" type.

According to another embodiment, the board further includes a plurality of electronic devices mounted on the second outer layer.

According to another embodiment, the printed circuit board includes a further inner ground layer interposed between the first outer layer and said inner layer, wherein the ground layer comprises a metal layer electrically connected to said ground reference by means of the first via and/or of the third via and electrically connected to the metal layer of the inner layer by means of the first via.

According to another embodiment, the board includes a plurality of supply pins electrically connected to the first power supply, a plurality of decoupling capacitors mounted on the second outer layer in proximity of a respective external supply pin of the plurality of supply pins, wherein each of the decoupling capacitors has a first pin electrically connected to a respective supply pin of the plurality of supply pins, wherein the inner layer comprises a plurality of metal layers separated from each other on the inner layer and electrically connected to the exposed pad by means of a respective via, wherein each of the plurality of decoupling capacitors has a second pin electrically connected to a respective metal layer of the plurality of metal layers by means of a respective via.

The Applicant has perceived that the printed circuit board according to some embodiments allows reducing the emission of electro-magnetic radiation even in the case of the use of QFP packages with a single ground exposed pad and in the case of the use of at least two power supplies with supply currents having different frequency components.

BRIEF DESCRIPTION OF THE DRAWINGS

Further characteristics and advantages will be apparent the following description of an embodiment and variants thereof given by way of example with reference to the accompanying drawings, wherein.

DETAILED DESCRIPTION

Figure 1A:
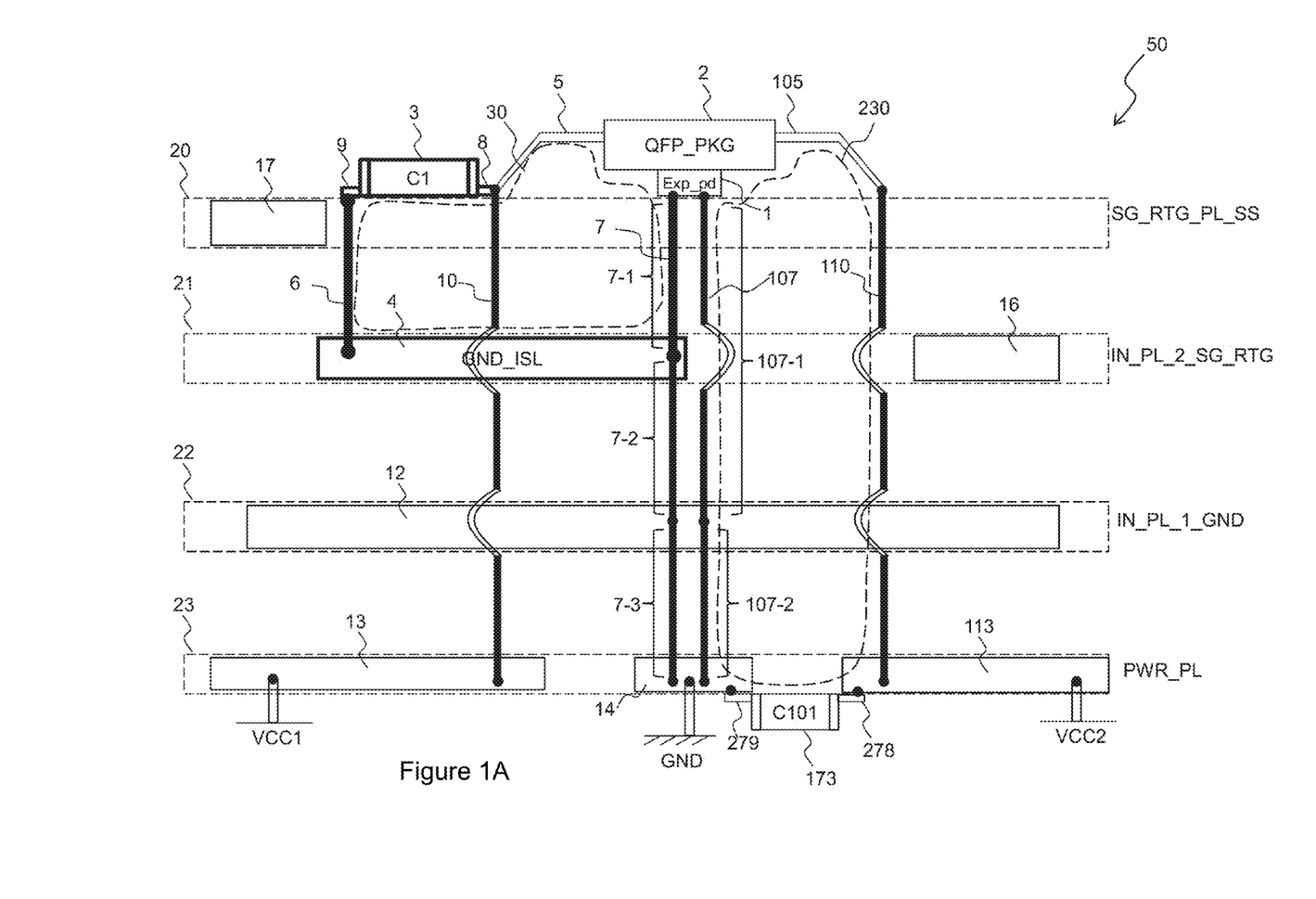
FIG. 1A schematically shows a sectional view of a printed circuit board according to a first embodiment.

With reference to FIG. 1A, it is shown a sectional view of a printed circuit board 50 according to the first embodiment.

The printed circuit board 50 comprises:
four layers 20, 21, 22, 23;
a package 2 of QFP type with a single ground exposed pad 1;
a first decoupling capacitor 3;
a second decoupling capacitor 173;
a plurality of electrical connections 6, 7, 10, 107, 110 (commonly indicated with the term "vias") between two or more layers 20, 21, 22, 23;
a layer of electrically insulating material (for example, of FR-4 type) interposed between two contiguous layers (for the sake of simplicity the insulating layer between two contiguous layers is not shown in FIG. 1A).

The board 50 is supplied by a first power supply including a local voltage regulator mounted on the board 50 or external to the board 50, such to generate a first power supply voltage VCC1 and a corresponding first supply current ICC1; alternatively, the first power supply can be a voltage regulator mounted on another board and supplying multiple boards.

The board 50 is also supplied by a second power supply including a local voltage regulator mounted on the board 50 or external to the board 50, such to generate a second power supply voltage VCC2 and a corresponding second supply current ICC2; alternatively, the second power supply can be a voltage regulator mounted on another board and supplying multiple boards.

The first supply current ICC1 has switching with transients having a higher frequency than the frequency of the transients of the switching of the second supply current ICC2. For example, the value of the first power supply voltage VCC1 is equal to 1.2 V and the first supply current ICC1 has switching with frequency transients of tens or hundreds of Megahertz, while the value of the second power supply voltage VCC2 is equal to 3.3 V and the second supply current ICC2 has switching with frequency transients of tens or hundreds of Kilohertz.

The QFP package 2 (and thus the integrated circuit enclosed by the package 2) comprises a first supply pin 5 electrically connected to the first power supply and comprises a second supply pin 105 electrically connected to the second power supply.

The QFP package 2 with single ground exposed pad 1 includes an integrated circuit which can be for example a micro-processor or an integrated circuit of digital type, wherein the part of the internal logic is supplied by the first power supply voltage VCC1 (for example equal to 1.2 V) generated by the first power supply and wherein the interface circuits towards the outside connected with the input/output pins of the integrated circuit are supplied by the second power supply voltage VCC2 (for example equal to 3.3 V) generated by the second power supply.

A first outer layer 23 (indicated with "component side layer") includes an exposed outer surface which is an outer surface of the printed circuit board 50 and includes an inner surface contacting the surface of the insulating layer interposed between the first outer layer 23 and the inner layer 21.

The first outer layer 23 comprises a first metal layer 13 electrically connected towards the outside to the first power supply voltage VCC1 (for example, equal to 1.2 V) and comprises a second metal layer 113 electrically separated from the metal layer 13 and electrically connected towards the outside to the second power supply voltage VCC2.

The metal layer 13 has the function of providing the first power supply voltage VCC1 to the first supply pin 5 of the package 2 and has the function of providing the first power supply voltage VCC1 to the electronic components (for the sake of simplicity not shown in FIG. 1A) mounted on the first outer layer 23.

The metal layer 113 has the function of providing the second power supply voltage VCC2 to the second supply pin 105 of the package 2 and of providing the second power supply voltage VCC2 to the electronic components (for the sake of simplicity not shown in FIG. 1A) mounted on the first outer layer 23.

The first outer layer 23 further comprises a metal layer 14 electrically isolated from the metal layer 13 and from the metal layer 113; the metal layer 14 is connected towards the outside to a ground reference voltage.

The ground layer 22 is internal to the printed circuit board 50, is contiguous to the first outer layer 23 and is interposed between the first outer layer 23 and the layer 21. The ground layer 22 includes a surface contacting the surface of the insulating layer interposed between the ground layer 22 and the first outer layer 23 and includes another surface contacting the surface of the insulating layer interposed between the ground layer 22 and the inner layer 21. The ground layer 22 comprises a metal layer 12 which has the function of distributing a ground reference voltage to the exposed pad 1 and to the ground pins of the electronic components mounted on the first outer layer 23; moreover, the metal layer 12 is connected towards the outside of the board 50 to a ground reference voltage by means of the portion 7-3 of the via 7 and by means of the portion 107-3 of the via 107. The ground connection towards the outside can be implemented, for example, with a star connection towards the common terminal of the local voltage regulators or by means of a connector and wirings towards the common terminal of the external voltage regulators; another connection can be formed by diffused continuous ground layers connected to the common terminal of the voltage regulators.

The inner layer 21 is internal to the printed circuit board 50 and is interposed between the ground layer 22 and the second outer layer 20. In particular, the inner layer 21 is contiguous to the second outer layer 20, meaning that the inner layer 21 is close to the second outer layer 20 and is not in contact therewith. More in particular, the inner layer 21 includes a surface contacting the surface of the insulating layer interposed between the inner layer 21 and the second outer surface 20 and includes another surface contacting the surface of the insulating layer interposed between the inner layer 21 and the ground layer 22.

Alternatively, the inner layer 21 is interposed between the second outer layer 20 and the first outer layer 23 and is not contiguous to the second outer layer 20, meaning that one or more further layers can be interposed between the second outer layer 20 and the inner layer 21; moreover, more than one layer can be interposed between the inner layer 21 and the first outer layer 23.

The inner layer 21 comprises a metal layer 16 on which metal tracks are formed to make the connections between the input/output pins of the package 2 and sensors, actuators, the connections between the input/output pins of the package 2 with communication lines of components mounted on the first outer layer 23 (or mounted on other boards) and the connections between electronic components mounted on the first outer layer 23.

The inner layer 21 comprises a further metal layer 4 indicated hereinafter by "ground island 4" which is electrically separated from the metal layer 16 and has the function to create a first local loop 30 (shown in FIG. 1A with a dashed line) for the return current towards ground relating to the first power supply voltage VCC1, in order to reduce the electromagnetic radiation emitted by the printed circuit board 50, as it will be explained more in detail below.

A second outer layer 20 (indicated with "soldering side layer") includes an exposed outer surface which is an outer surface of the board 50 opposite to the outer surface of the first outer layer 23 and includes an inner surface contacting the surface of the insulating layer interposed between the second outer layer 23 and the ground layer 22. The second outer layer 20 comprises a metal layer 17 which has the function of making the connections between the first supply pin 5 of the package 2 and a terminal 8 of the first decoupling capacitor 3, the connections between the signal pins of the package 2, the connections of the signal pins of the package 2 with the other components mounted on the board 50 and the connections between the electronic components mounted on the first outer layer 23.

The QFP package 2 (and thus the integrated circuit enclosed by the package 2) is mounted on the exposed outer surface of the second outer layer 20 and the exposed pad 1 is electrically connected to:

the ground island 4 by means of the portion 7-1 of the via 7;

the metal layer 12 of the ground layer 22 by means of the portions 7-1, 7-2 of the via 7 and by means of the portion 107-1 of the via 107;

the metal layer 14 of the first outer layer 23 by means of the Via 7 composed of the portions 7-1, 7-2, 7-3 and by means of the via 107 composed of the portions 107-1, 107-2.

The physical connection between the exposed pad 1 and the metal layer 14 (obtained by means of the connection with the vias 7 and 107) allows improving the thermal dissipation of the QFP package 2, because it creates a path with high thermal conductivity.

It has to be noticed that for the sake of simplicity in FIG. 1A it is shown only one via 7, but it is possible that the via 7 is made of a plurality of vias 7a, 7b, 7c, ... substantially parallel each other which electrically connect the exposed pad 1 to the ground island 4, to the metal layer 12 and to the metal layer 14: in this way the inductance of the electrical connection between the exposed pad 1 and the ground island 4 and between the exposed pad 1 and the metal layer 14 is reduced.

Similarly, in FIG. 1A a single via 107 is shown, but it is possible that the via 107 is made of a plurality of vias 107a, 107b, 107c, ... substantially parallel each other which electrically connect the exposed pad 1 to the metal layer 12 and to the metal layer 14.

The QFP package 2 has the first supply pin 5 electrically connected to the metal layer 13 of the first outer layer 23 (in turn connected to the first power supply voltage VCC1) by means of the via 10 and it has the second supply pin 105 electrically connected to the metal layer 113 of the first outer layer 23 (in turn connected to the second power supply voltage VCC2) by means of the via 110. It has to be noticed that for the sake of simplicity in FIG. 1A a single via 10 is shown, but it is possible that the via 10 is made of a plurality of vias 10a, 10b, 10c, ... which electrically connect the first supply pin 5 with the metal layer 13 of the first outer layer 23; similarly, in FIG. 1A it is indicated only one via 110, but it is possible that the via 110 is made of a plurality of vias 110a, 110b, 110c, ... which electrically connect the second supply pin 105 with the metal layer 113 of the first outer layer 23.

The first decoupling capacitor 3 is mounted on the exposed outer surface of the second outer layer 20 in the proximity of the first supply pin 5 of the package 2. In particular, the first decoupling capacitor 3 comprises a first terminal 8 electrically connected to the first supply pin 5 of the package 2 by means of a wide track 17-1 and of an almost zero length on the metal layer 17 and comprises a second terminal 9 electrically connected to the ground island 4 by means of the via 6.

The second decoupling capacitor 173 is mounted on the exposed outer surface of the first outer layer 23, thus on a side opposite to that of the first decoupling capacitor 3. In particular, the second decoupling capacitor 173 comprises a first pin 278 electrically connected to the metal layer 113 of the first outer layer 23 (in turn connected to the second power supply voltage VCC2) and to the second supply pin 105 of the package 2 by means of the via 110 and comprises a second pin 279 electrically connected to the metal track 14 (in turn connected to the reference voltage to ground) and to the exposed pad 1 by means of via 107.

The first decoupling capacitor 3 has the function (together with the ground island 4) to create the first local loop 30 for the return current towards ground relating to the first power supply voltage VCC1, in order to reduce the inductance of the path of the return current towards ground relating to the first power supply voltage VCC1 and thus to reduce the electromagnetic radiation emitted by the printed circuit board 50, as will be explained more in detail below.

Therefore the first decoupling capacitor 3 has the function of local reserve of electric charge, able to provide the current required to perform abrupt transitions of the values of the first supply current ICC1 that flows through the first supply pin 5 required for the operation of the integrated circuit enclosed by the package 2, dampening the peaks of the dynamic fluctuations of the first power supply voltage VCC1 caused by abrupt transitions of the first supply current ICC1 and thereby reducing the emission of electro-magnetic radiation from the board 50.

It has to be noticed that the connection (by means of the track 17-1) between the first supply pin 5 of the package 2 and the first terminal 8 of the first decoupling capacitor 3 does not cross the metal layer 13 of the first outer layer 23 and thus it is reduced the propagation of the noise (generated by the switching of the current absorbed by the first supply pin 5)

towards the first outer layer 23, which would cause the emission of electro-magnetic radiation from the board 50.

It has to be noticed that in FIG. 1A the symbol of a black dot is used to indicate the presence of an electrical contact (for example, an electrical contact between a via and a layer of the board, between two pins of electronic components, between a pin and a via), while it is used the symbol of a bridge to indicate that a via is not electrically connected with a layer of the board at the point where the bridge crosses the layer.

The ground island 4 is electrically connected with the second terminal 9 of the first decoupling capacitor 3 by means of the via 6, is electrically connected with the exposed pad 1 by means of the portion 7-1 of the via 7, is electrically connected with the metal layer 12 of ground layer 22 by means of the portion 7-2 of the via 7 and is electrically connected to the metal layer 14 of the first outer layer 23 by means of the portions 7-2, 7-3 of the via 7.

The set of the first supply pin 5, of the integrated circuit enclosed by the QFP package 2, of the exposed pad 1, of the portion 7-1 of via 7, of the ground island 4, of the via 6 and of the first decoupling capacitor 3 has the function to create the first local loop 30 which allows the current flowing through the first supply pin 5 to return towards the ground reference by means of a low inductance path. In fact, the sizes (meaning the length of the perimeter) of the first local loop 30 are reduced and thus the value of the inductance of the path formed by the first local loop 30 is small or much smaller than the one of the path (see 230 in FIG. 1A) formed by the second decoupling capacitor 173 mounted on the first outer layer 23. It is known that in alternating current the currents follow the path having the minimum inductance and this behavior increases as the frequency increases; as a result, the return current—typically with high frequency components—tends to flow through the first local loop 30 having lower inductance, while a return current—typically with low frequency components—flows mainly through the metal layer 12 of the ground layer 22. In this way it is reduced the electro-magnetic radiation emitted by the printed circuit board 50 due to switching with high frequency transients of the first supply current ICC1 that flows through the first supply pin 5, because the return current with high frequency components remains limited in the first local loop 30 having a small inductance value: this allows a high suppression of the noise with high frequency components generated by the switching of the first supply pin 5 of the integrated circuit enclosed by the package 2 and thereby reduces the total emission of the electro-magnetic radiation of the board 50.

In one embodiment, the thickness of the insulating layer comprised between the second outer layer 20 and the inner layer 21 is smaller than the thickness between the inner layer 21 and the ground layer 22: this helps to further reduce the size of the first local loop 30.

For example, the first supply pin 5 is such to receive a voltage value equal to 1.2 V, which is used to supply the part of the logic internal to the digital type integrated circuit enclosed by the QFP package 2; said internal logic is such to synchronously operate according to a clock signal with high frequency values, for example of tens or hundreds of Megahertz. Therefore the internal logic during its operation is such to require absorption peaks of the first supply current ICC1 in correspondence with the switching of the logic values at very high frequencies and this requires switching with high frequency transients of the value of the first supply current ICC1 that flows in the first supply pin 5, which would be a source of electro-magnetic radiation emitted by the board 50 if the first local loop 30 were not present.

The second decoupling capacitor 173 has functions to create a second loop 230 for the return current towards ground relating to the second power supply voltage VCC2 and having switching with low frequency transients, in order to reduce the electro-magnetic radiation emitted by the printed circuit board 50.

Therefore the second decoupling capacitor 173 functions as a local reserve of electric charge, able to provide the current required to perform switching with low frequency transients of the second supply current ICC2 that flows through the second supply pin 105 required for the operation of the integrated circuit enclosed by the package 2, dampening the peaks of the second power supply voltage VCC2 caused by switching with low frequency transients of the second supply current ICC2.

In particular, the second loop 230 is composed of the second supply pin 105, the via 110, the second decoupling capacitor 173, the via 107, the exposed pad 1 and the integrated circuit enclosed by the QFP package 2.

The second loop 230 has, however, sizes (meaning the length of the perimeter) greater than the ones of the first local loop 30 and thus it has an inductance greater than that of the first local loop 30. Consequently, in the second loop 230 flows a return current towards ground relating to the second power supply voltage VCC2 and mainly having switching with transients having lower frequency than the frequency of the transients of the switching of the return current towards ground flowing in the first local loop 30: this enables—despite of the presence of the ground pin 1 which performs the short-circuit of the two return paths towards ground relating to the first and the second power supply voltage VCC1 and VCC2—to separate:

the return current flowing through the second loop 230 towards ground and having switching with low frequency transients;

from the return current that flows through the first local loop 30 towards ground and having switching with high frequency transients.

In this way it greatly reduces the propagation in the board 50 (in particular, on the ground layer 22 and on the first outer layer 23) for the high frequency current components and it allows the propagation within the board 50 mainly of the low frequency current components; consequently, it reduces the generation of the common mode currents and thus it greatly reduces the emission of electro-magnetic radiation by the board 50.

It has to be noticed that the portion 7-1 of the via 7 is such to carry a current from the second outer layer 20 to the inner layer 21, while the via 6 placed near the portion 7-1 and substantially parallel to it is such to carry a current from the inner layer 21 to the second outer layer 20, thus having opposite direction: the current flowing through the via 6 is such to generate an electro-magnetic field opposite to that generated by the current flowing through the portion 7-1 of the via 7, thus the generated electro-magnetic fields tend to neutralize. This further reduces the propagation within the board 50 of the high frequency current components and thereby helps to further reduce the electro-magnetic radiation emitted by the board 50.

In one embodiment, the package 2 has a substantially rectangular shape and contains for each side a supply pin similar to the first supply pin 5 and such to receive the first power supply voltage VCC1. In this case, on the second outer layer 20 are mounted four decoupling capacitors 3-1, 3-2, 3-3, 3-4 similar to the decoupling capacitor 3, having the same capacitance value, positioned one on each side and each one in the proximity of a respective supply pin; moreover, in the inner layer 21 there are four ground islands 4-1, 4-2, 4-3, 4-4 separated from each other and similar to the ground island 4, one for each decoupling capacitor 3-1, 3-2, 3-3, 3-4. Each of the decoupling capacitors of 3-1, 3-2, 3-3, 3-4 has the same function of the first decoupling capacitor 3, that is to create respective local loops 30-1, 30-2, 30-3, 30-4 for the return current towards ground with high frequency components, each one for a respective supply pin. The presence of the four decoupling capacitors 3-1, 3-2, 3-3, 3-4 allows to further damp the peaks of the dynamic fluctuations of the first power supply voltage VCC1.

Similarly, the package 2 contains for each side a supply pin similar to the second supply pin 105 and such to receive the second power supply voltage VCC2. In this case, on the first outer layer 23 are mounted four decoupling capacitors 173-1, 173-2, 173-3, 173-4 similar to the second decoupling capacitor 173, having the same capacitance value, placed one on each side and each one in the proximity of a respective supply pin. Each one of the decoupling capacitors 173-1, 173-2, 173-3, 173-4 has the same function of the second decoupling capacitor 173, that is to create respective loops 230-1, 230-2, 230-3, 230-4 for the return current towards ground with low frequency components, wherein each of the loops 230-1, 230-2, 230-3, 230-4 is associated with a respective supply pin.

Figure 2A:
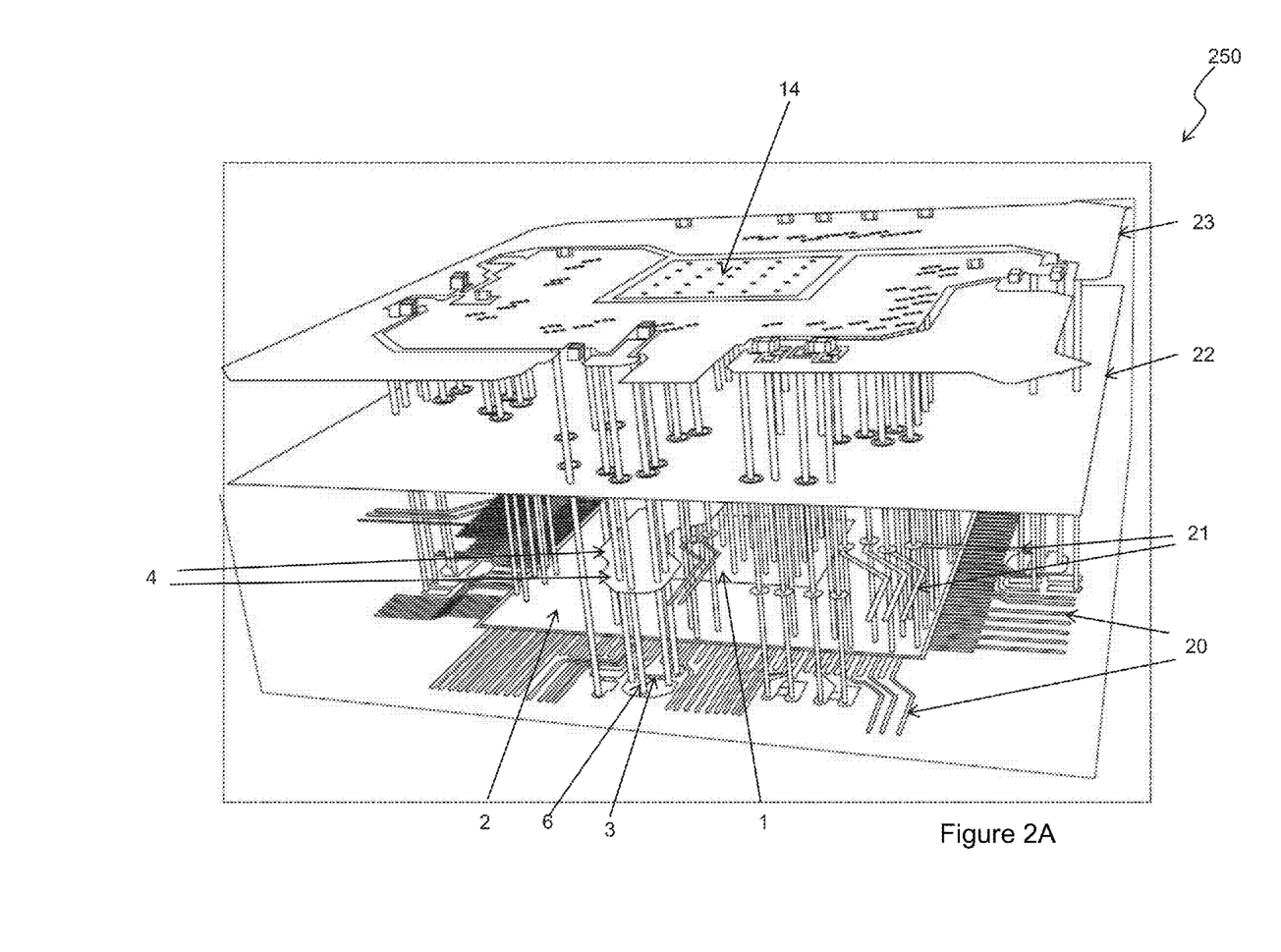
FIG. 2A schematically shows a perspective view of a printed circuit board according to an embodiment mounted on an integrated circuit enclosed by a QFP package with single ground exposed pad.

FIG. 2A shows a perspective view of a printed circuit board 250 according to an embodiment. On the board 250 is mounted an integrated circuit enclosed by the QFP package 2 with single ground exposed pad 1. It has to be noticed that in FIG. 2A the layers of the board 250 are shown in opposite order with respect to those of the board 50 shown in FIG. 1A, that is in the board 250 of FIG. 2 the first outer layer 23 is shown at the top (while in the board 50 of FIG. 1A the first outer layer 23 is shown at the bottom) and the second outer layer 20 of the board 250 is shown at the bottom (while in the board 50 the second outer layer 20 is shown at the top).

The layers 20, 21, 22, 23 of the board 250 perform the same function of the layers 20, 21, 22, 23 of the board 50 respectively.

The following observations are possible:
the inner layer 21 of the board 250 comprises a ground island 4, which has a function similar to the ground island 4 of the inner layer 21 of the board 50;
the QFP package 2 comprises an exposed pad 1;
the decoupling capacitor 3 has the terminals 8, 9;
the via 6 of the board 250 has the same function of the via 6 of the board 50;
the metal layer 14 has the same function of the metal layer 14 of the board 50, that is to create (similar to a "chimney") a path with high thermal conductivity which allows to improve the extraction of heat from the integrated circuit enclosed by the package 2.

Figure 2B:
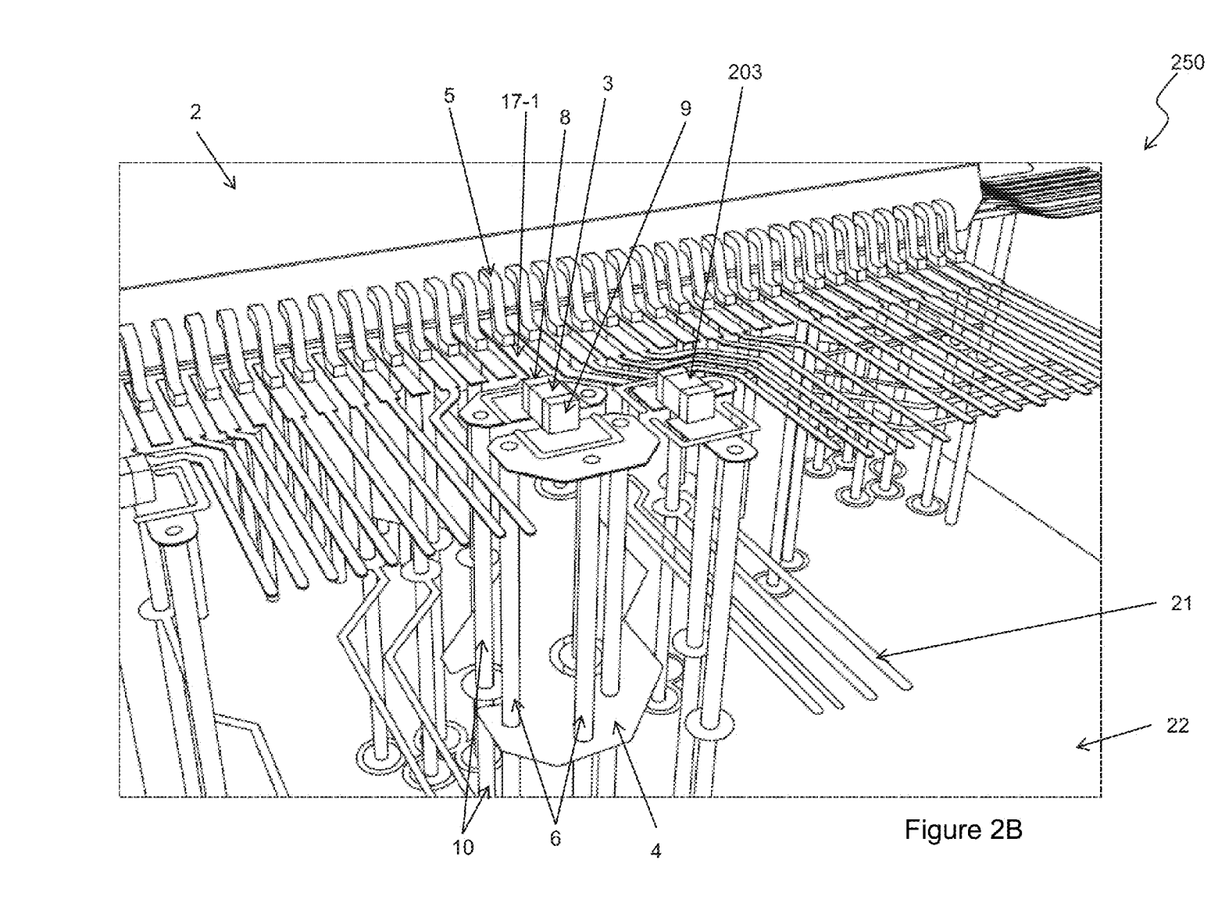
FIG. 2B shows more in detail a part of the perspective view of FIG. 2A.

FIG. 2B shows more in detail a part of the perspective view of FIG. 2A. It should be noted that identical elements are indicated in FIG. 2A and 2B with the same references numbers.

Moreover, it has to be noticed that in FIG. 2B the layers of the board 250 are shown again in opposite order with respect to the layers of the board 250 of FIG. 2A (and thus the layers of the board 250 in FIG. 2B are shown in the same order of FIG. 1A), in order to highlight the position of the first decoupling capacitor 3.

In particular, FIG. 2B shows more in detail the supply pin 5 and it shows the via 10 which is such to electrically connect the supply pin 5 to the metal layer 13 (not shown in FIG. 2B) of the component side outer layer connected to the first power supply voltage VCC1. Moreover, FIG. 2B shows more in detail the ground island 4 electrically connected to the terminal 9 of the first decoupling capacitor 3 by means of the via 6 and shows that the supply terminal 5 of the QFP package 2 is electrically connected to the terminal 8 of the capacitor 3 by means of a wide metal track 17-1 and of an almost zero length.

Figure 3A:
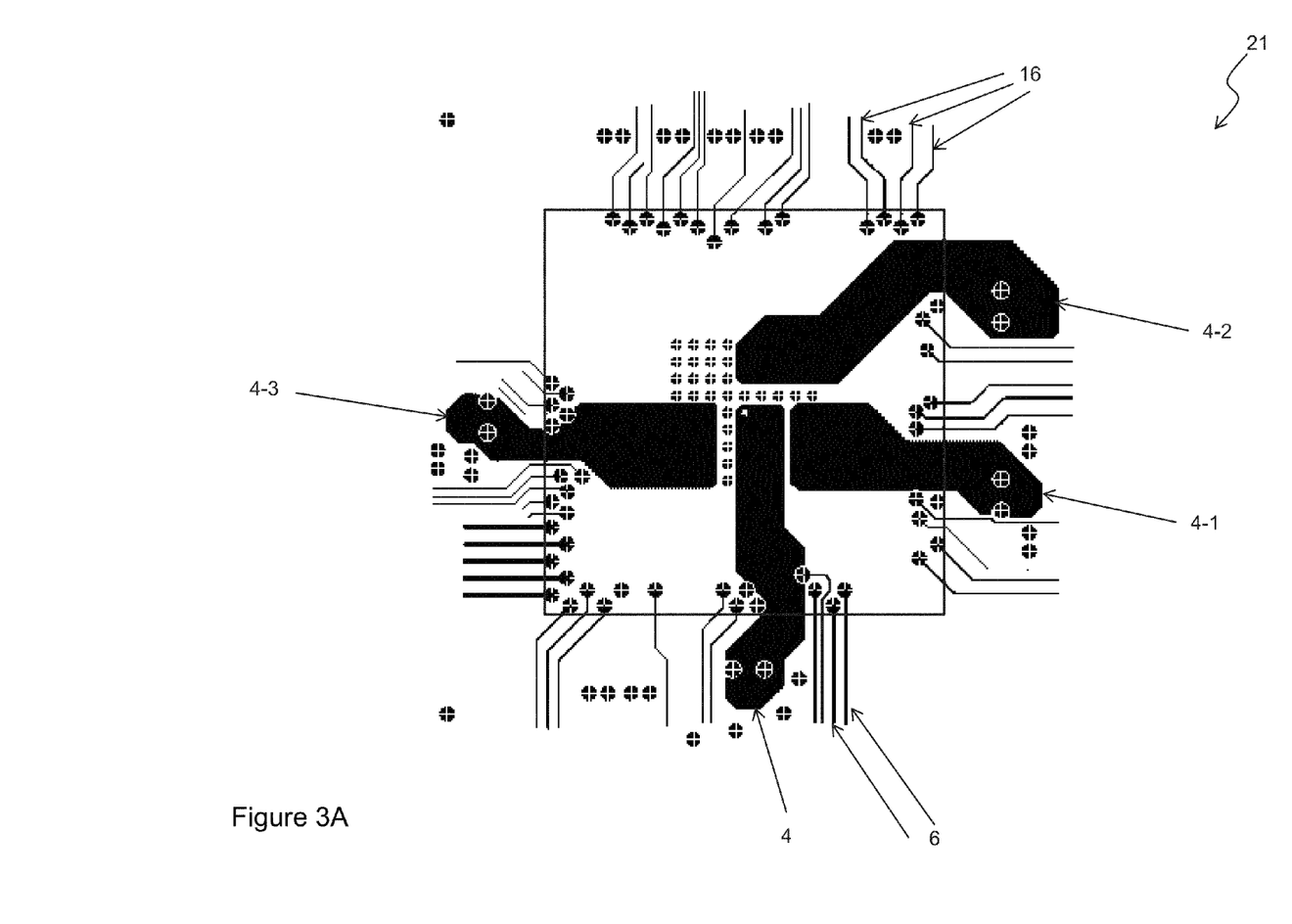
FIG. 3A shows a top view of a layer inside the printed circuit board according to an embodiment.

FIG. 3A shows a top view of the inner layer 21 of the printed circuit board 250. It is possible to note the presence of the ground island 4 which electrically connects the terminal 9 of the first decoupling capacitor 3 (not visible in FIG. 3A because it is mounted on another outer layer 20) with the exposed pad 1, of which are visible a plurality of vias that have the function to electrically connect the exposed pad 1 with the ground island 4.

It is also possible to note the presence of the tracks of the metal layer 16 which connect the pins of the package 2 with other electric components mounted on the outer side components.

In one embodiment, the inner layer 21 comprises four ground islands 4, 4-1, 4-2, 4-3 which are electrically short-circuited to each other by means of the common connection with the exposed pad 1. Each of the four ground islands 4, 4-1, 4-2, 4-3 has associated with it a respective decoupling capacitor and implements a respective return path towards ground with a low inductance such to allow a respective current with high frequency components to flow through it. The presence of a plurality of return paths with low inductance has the purpose of trying to force the separation of the return currents towards ground relating to different sources of power supplies voltages, because it tries to impose an electrical separation between the return paths that are not physically separated due to the short-circuit with the exposed pad 1. In this way it is attempted to further reduce the generation of common mode currents and thus to further reduce the generation of electro-magnetic radiation by the board 250.

In FIG. 3A it is possible to note that despite the presence of the plurality of ground islands 4, 4-1, 4-2, 4-3 on the inner layer 21, a large surface area is available for the metal layer tracks 16 and thus there is a large surface area for performing the routing of the connections of the input/output pins of the integrated circuit enclosed by the package 2.

Figure 3B:
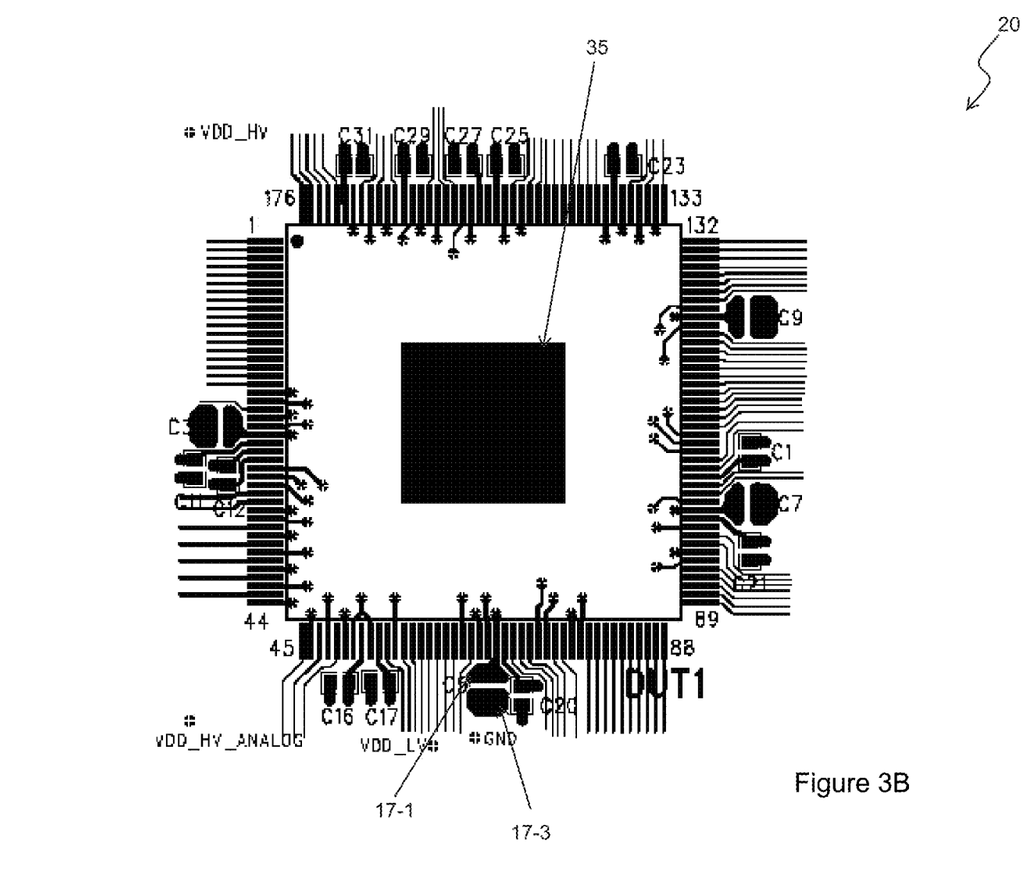
FIG. 3B shows a top view of an outer layer of the printed circuit board according to an embodiment.

FIG. 3B shows a top view of the second outer layer 20 of the printed circuit board 250. It is possible to note the presence of a metal area 35 on which the exposed pad 1 of the QFP package 2 is soldered. It is also possible to note the presence of a metal area 17-3 on which the terminal 9 of the first decoupling capacitor 3 is soldered and the metal zone 17-1 on which the supply pin 5 of the QFP package 2 is soldered.

Figure 1B:
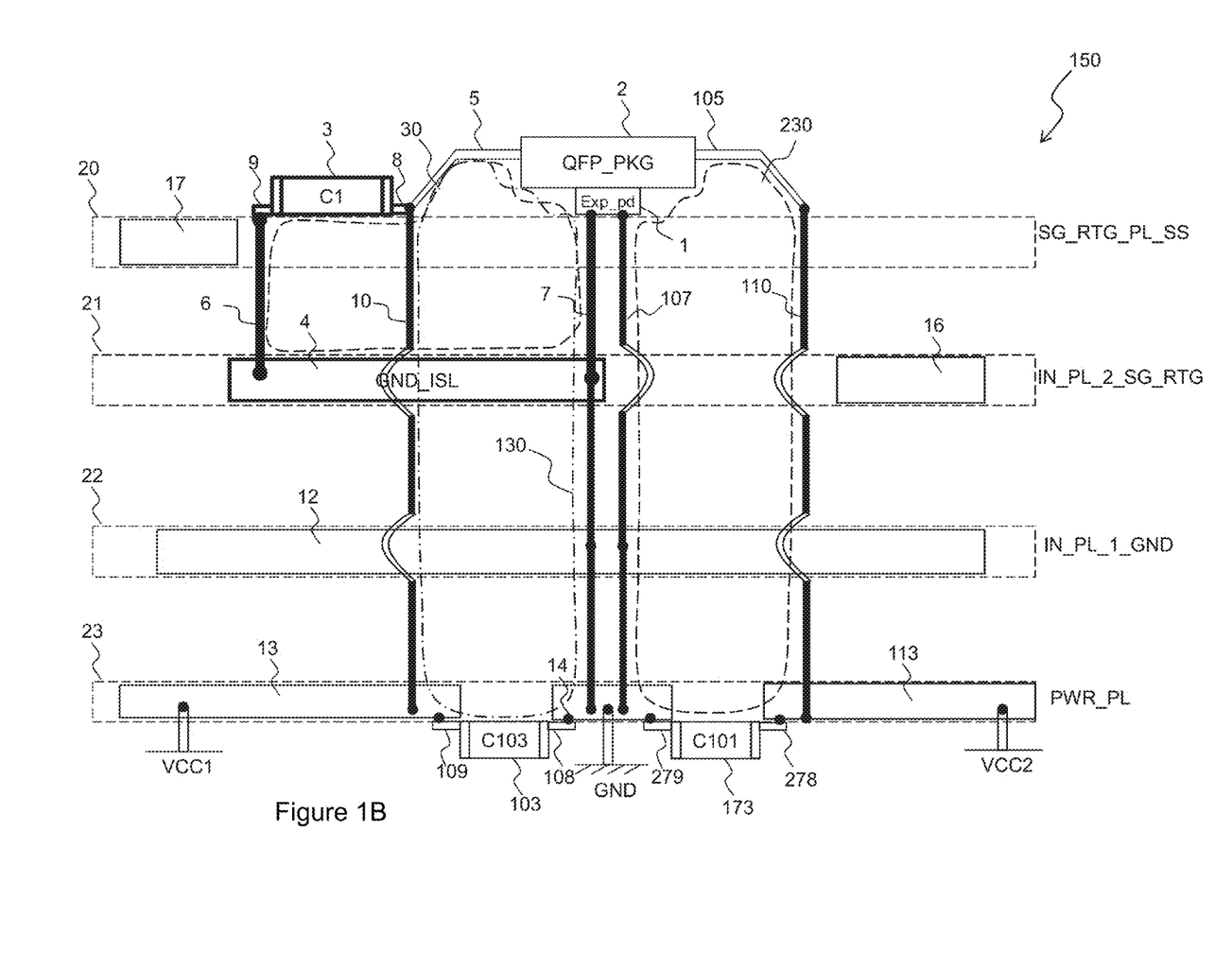
FIG. 1B schematically shows a sectional view of a printed circuit board according to a second embodiment.

With reference to FIG. 1B, it shows a sectional view of a printed circuit board 150 according to the second embodiment. It should be noted that identical elements have been indicated in FIGS. 1A and 1B with the same reference numbers.

The second embodiment differs from the first for the presence of a third decoupling capacitor 103 mounted on the exposed outer surface of the first outer layer 23, thus on a side opposite to that of the first decoupling capacitor 3.

The decoupling capacitor 103 comprises a first pin 109 electrically connected to the metal layer 13 (in turn connected to the first power supply voltage VCC1) and comprises a second pin 108 electrically connected to the metal layer 14 (in turn connected to the ground reference voltage).

The decoupling capacitor 103 has the function to create a third loop 130 (shown in FIG. 1B with a dashed and dotted line) for the return current towards ground, in order to further reduce the electro-magnetic radiation emitted by the printed circuit board 150. In particular, the third loop 130 is composed of the first supply pin 5, the integrated circuit enclosed by the QFP package 2, the exposed pad 1, the via 7, the decoupling capacitor 103 and the via 10.

The third loop 130 has sizes (meaning the length of the perimeter) greater than those of the first local loop 30 and thus it has an inductance greater than that of the first local loop 30. Consequently, the third loop 130 conducts a return current towards ground relating to the first power supply voltage VCC1 and having components of frequency smaller than the frequency components of the return current towards ground that flows through the first local loop 30.

Figure 1C:
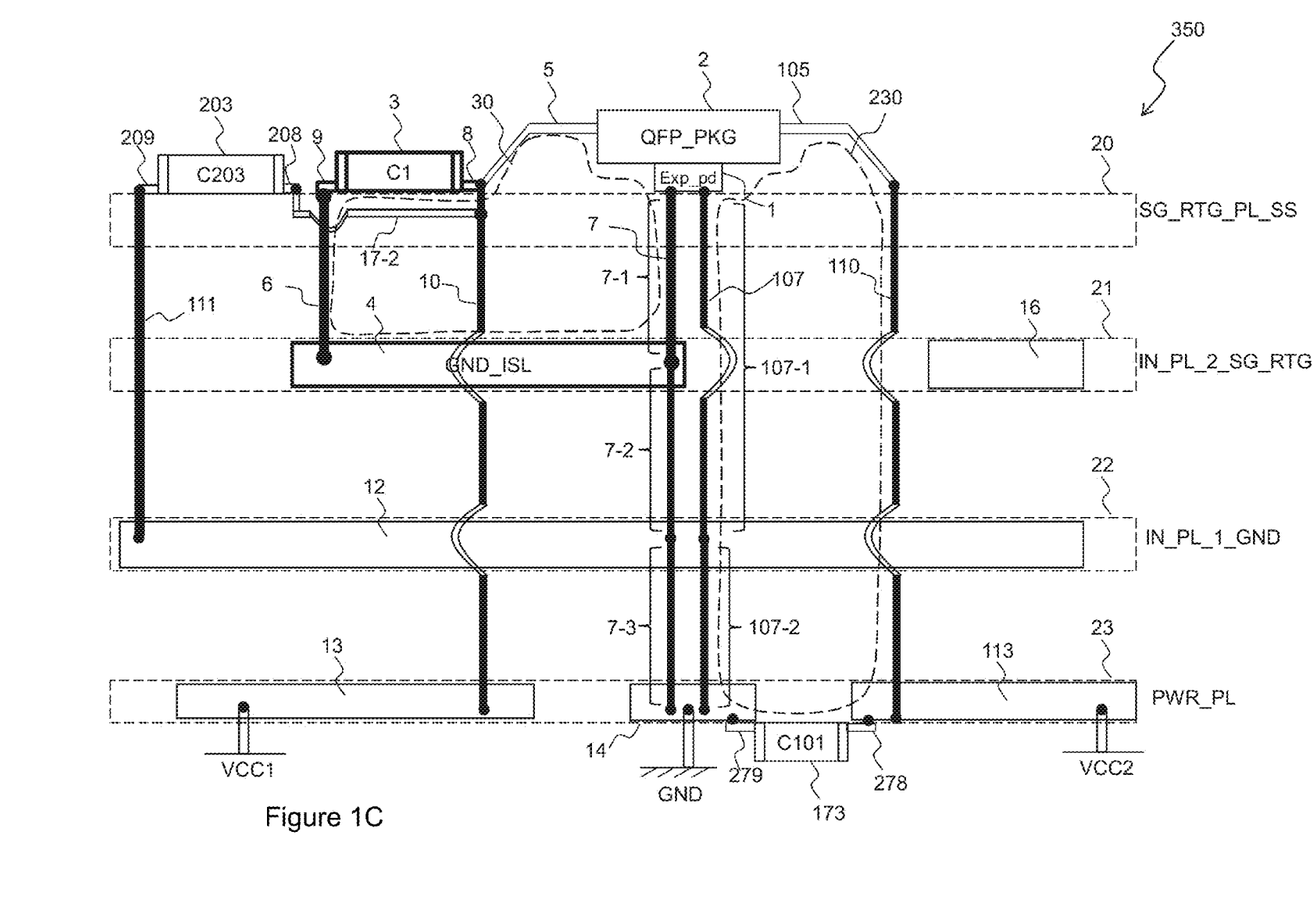
FIG. 1C schematically shows a sectional view of a printed circuit board according to a third embodiment.

With reference to FIG. 1C, there is shown a sectional view of a printed circuit board 350 according to the third embodiment. It has to be noted that identical elements are indicated in FIGS. 1A and 1C with the same reference numbers.

The third embodiment differs from the first for the presence of an additional decoupling capacitor 203 mounted on the exposed outer surface of the second outer layer 20, thus on the same side of the first decoupling capacitor 3.

It has to be noted that the position of the decoupling capacitor 203 shown in FIG. 1C has only the purpose of explaining the third embodiment and that the actual position of the decoupling capacitor 203 could be different from that shown in FIG. 1C. In particular, the decoupling capacitor 203 is mounted so as to be section-aligned with respect to the first decoupling capacitor 3, as shown for the capacitors 3 and 203 in FIG. 2B.

The decoupling capacitor 203 is placed in the proximity of the first supply pin 5 and comprises a first pin 209 electrically connected to the metal layer 12 of the ground layer 22 by means of a via 111 and comprises a second pin 208 electrically connected to the first supply pin 5 by means of a metal track 17-2 on the metal layer 17.

The decoupling capacitor 203 has a function similar to that of the third decoupling capacitor 103 of the second embodiment, that is to create an additional return path towards ground for the current relating to the first power supply voltage VCC1 and having low frequency components.

In one embodiment, the capacitance value of the second decoupling capacitor 173 is about three times the value of the capacitance of the first decoupling capacitor 3. For example, the capacitance value of the second decoupling capacitor 173 is equal to 300 nF and the capacitance value of the first decoupling capacitor 3 is equal to 100 nF.

Similarly, the capacitance value of the third decoupling capacitor 103 (or of the decoupling capacitor 203) is about three times the capacitance value of the first decoupling capacitor 3. For example, the capacitance value of the third decoupling capacitor 103 (or of the decoupling capacitor 203) is equal to 300 nF and the capacitance value of the first decoupling capacitor 3 is equal to 100 nF.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A printed circuit board comprising:
a first outer layer;
a second outer layer;
an integrated circuit mounted on the second outer layer, said integrated circuit having:
a single exposed pad electrically connected to a ground reference,
a first supply pin electrically connected to a first power supply,
a second supply pin electrically connected to a second power supply,
wherein the first power supply is configured to generate a first supply current with frequency components higher than frequency components of a second supply current generated by the second power supply;
a first decoupling capacitor mounted on the second outer layer in the proximity of the first supply pin, the first decoupling capacitor having a first terminal electrically connected with the first supply pin and having a second terminal;
an inner layer interposed between the first outer layer and the second outer layer, the inner layer comprising a metal layer electrically connected to said ground reference;
a first via configured to electrically connect the exposed pad with the metal layer of the inner layer;
a second via configured to electrically connect the second terminal of the first decoupling capacitor with the metal layer of the inner layer;
a second decoupling capacitor having a first pin electrically connected to the second power supply and having a second pin electrically connected to said ground reference, wherein the value of the capacitance of the second decoupling capacitor is greater than the value of the capacitance of the first decoupling capacitor.

2. The printed circuit board according to claim 1, wherein the second decoupling capacitor is mounted on the first outer layer.

3. The printed circuit board according to claim 2, wherein the first outer layer comprises a first metal layer electrically connected to said ground reference, wherein the first via is further configured to electrically connect the metal layer of the inner layer with the first metal layer of the second outer layer and wherein the second pin of the second decoupling capacitor is electrically connected to the first metal layer of the second outer layer.

4. The printed circuit board according to claim 3, further comprising a third via configured to electrically connect the exposed pad with the first metal layer of the second outer layer.

5. The printed circuit board according to claim 4, wherein the second outer layer comprises a second metal layer electrically connected to the first power supply, the board further comprising a fourth via configured to electrically connect the first supply pin and the first pin of the first decoupling capacitor with the second metal layer of the second outer layer.

6. The printed circuit board according to claim 5, wherein the second outer layer further comprises a third metal layer electrically connected to the second power supply,
the board further comprising a fifth via configured to electrically connect the second supply pin with the third metal layer of the first outer layer, and
the first pin of the second decoupling capacitor is electrically connected with the third metal layer of the second outer layer.

7. The printed circuit board according to claim 1, wherein the inner layer is contiguous to the second outer layer.

8. The printed circuit board according to claim 2, further comprising a third decoupling capacitor mounted on the second outer layer and having a first pin electrically connected to said ground reference and a second pin electrically connected to the first power supply.

9. The printed circuit board according to claim 1, wherein the value of the capacitance of the second decoupling capacitor is three times the value of the capacitance of the first decoupling capacitor.

10. The printed circuit board according to claim 1, wherein the integrated circuit is enclosed by a package of the "Quad-Flat Pack" type.

11. The printed circuit board according to claim 2, further comprising a plurality of electronic devices mounted on the second outer layer.

12. The printed circuit board according to claim 2, further comprising an inner ground layer interposed between the first outer layer and said inner layer, wherein the ground layer comprises a metal layer electrically connected to said ground reference by at least one of the first via and the third via and electrically connected to the metal layer of the inner layer by the first via.

13. The printed circuit board according to claim 1, further comprising:

a plurality of supply pins electrically connected to the first power supply;

a plurality of decoupling capacitors mounted on the second outer layer in proximity of a respective external supply pin of the plurality of supply pins, wherein each of the decoupling capacitors has a first pin electrically connected to a respective supply pin of the plurality of supply pins, wherein the inner layer comprises a plurality of metal layers separated from each other on the inner layer and electrically connected to the exposed pad by means of a respective via, wherein each of the plurality of decoupling capacitors has a second pin electrically connected to a respective metal layer of the plurality of metal layers by means of a respective via.

\* \* \* \* \*